US012716957B2

(12) United States Patent
Hwang et al.

(10) Patent No.: US 12,716,957 B2
(45) Date of Patent: Aug. 25, 2026

(54) BATTERY MANAGEMENT APPARATUS AND METHOD

(71) Applicant: LG ENERGY SOLUTION, LTD., Seoul (KR)

(72) Inventors: Jin Woo Hwang, Daejeon (KR); Geun Wook Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 308 days.

(21) Appl. No.: 18/283,740

(22) PCT Filed: Jun. 2, 2022

(86) PCT No.: PCT/KR2022/007853
§ 371 (c)(1),
(2) Date: Sep. 22, 2023

(87) PCT Pub. No.: WO2022/265277
PCT Pub. Date: Dec. 22, 2022

(65) Prior Publication Data

US 2024/0175937 A1 May 30, 2024

(30) Foreign Application Priority Data

Jun. 17, 2021 (KR) ........................ 10-2021-0078979

(51) Int. Cl.
*G01R 31/396* (2019.01)
*G01R 31/382* (2019.01)
(Continued)

(52) U.S. Cl.
CPC ......... *G01R 31/396* (2019.01); *G01R 31/382* (2019.01); *H01M 10/425* (2013.01); *H01M 2010/4271* (2013.01); *H02J 7/80* (2026.01)

(58) Field of Classification Search
CPC ................ G01R 31/396; G01R 31/382; G01R 19/16542; H01M 10/425;
(Continued)

(56) References Cited

U.S. PATENT DOCUMENTS

2006/0017582 A1 1/2006 Lockhard et al.
2013/0175857 A1 * 7/2013 Shreevani ............... B60L 50/66 307/9.1

(Continued)

FOREIGN PATENT DOCUMENTS

CN 103329338 A 9/2013
CN 107612054 A 1/2018

(Continued)

OTHER PUBLICATIONS

International Search Report (with partial translation) and Written Opinion dated Sep. 6, 2022, for corresponding International Patent Application No. PCT/KR2022/007853.

(Continued)

*Primary Examiner* — Daniel R Miller
(74) *Attorney, Agent, or Firm* — Morgan, Lewis & Bockius LLP

(57) ABSTRACT

A battery management apparatus includes a measuring unit configured to measure a link voltage of each of a plurality of battery packs and a determining unit configured to control a switching circuit provided in each of the plurality of battery packs and determine a connection state of the plurality of battery packs based on a link voltage of the plurality of battery packs corresponding to a driving state of the switching circuit.

19 Claims, 6 Drawing Sheets

(51) Int. Cl.
*H01M 10/42* (2006.01)
*H02J 7/80* (2026.01)

(58) Field of Classification Search
CPC ........... H01M 2010/4271; H02J 7/0047; H02J 7/00304; H02J 7/0031; H02J 7/0024; H02J 7/0036; Y02E 60/10
See application file for complete search history.

(56) References Cited

U.S. PATENT DOCUMENTS

| | | | | |
|---|---|---|---|---|
| 2013/0202930 | A1 | 8/2013 | Kumagai | |
| 2013/0300370 | A1 | 11/2013 | Hotta | |
| 2014/0147711 | A1 | 5/2014 | Takeda et al. | |
| 2016/0226263 | A1 | 8/2016 | Seo et al. | |
| 2016/0241052 | A1* | 8/2016 | Yang | H02J 7/0048 |
| 2018/0241227 | A1 | 8/2018 | Halsey | |
| 2019/0103750 | A1 | 4/2019 | Kristensen | |
| 2022/0179008 | A1 | 6/2022 | Lee et al. | |

FOREIGN PATENT DOCUMENTS

| | | | | | |
|---|---|---|---|---|---|
| CN | 107910912 | A | | 4/2018 | |
| CN | 108461696 | A | | 8/2018 | |
| JP | 2012-090485 | A | | 5/2012 | |
| JP | 5194669 | B2 | | 5/2013 | |
| JP | 5461686 | B2 | | 4/2014 | |
| JP | 2018-153034 | A | | 9/2018 | |
| JP | 2019-164897 | A | | 9/2019 | |
| JP | 2020-034277 | A | | 3/2020 | |
| KR | 10-1481207 | B1 | | 1/2015 | |
| KR | 10-2016-0095524 | A | | 8/2016 | |
| KR | 10-2017-0049198 | A | | 5/2017 | |
| KR | 10-2005395 | B1 | | 7/2019 | |
| KR | 10-2021-0047750 | A | | 4/2021 | |
| KR | 20210047156 | A | * | 4/2021 | H01M 10/4264 |
| KR | 10-2021-0050443 | A | | 5/2021 | |
| KR | 10-2021-0059217 | A | | 5/2021 | |
| KR | 20210058717 | A | * | 5/2021 | G01R 19/1659 |

OTHER PUBLICATIONS

Office Action issued on Aug. 13, 2024, in Japanese Patent Application No. 2023-559803 (with English translation).

Office Action issued on Jun. 6, 2026 in corresponding Chinese Patent Application No. 202280022839.8.

* cited by examiner

BATTERY MANAGEMENT APPARATUS AND METHOD

CROSS-REFERENCE TO RELATED APPLICATION

This application claims priority to and the benefit of Korean Patent Application No. 10-2021-0078979 filed in the Korean Intellectual Property Office on Jun. 17, 2021, the entire contents of which are incorporated herein by reference.

TECHNICAL FIELD

Embodiments disclosed herein relate to a battery management apparatus and method.

BACKGROUND ART

A secondary battery is generally used as a battery pack including a battery module where a plurality of battery cells are connected to one another in series and/or in parallel. Battery packs may be managed and controlled by a battery management system in terms of their states and operations.

Among such battery packs, a standalone battery pack has embedded therein a field effect transistor (FET) to have its own protection function. The battery packs conventionally allow only parallel connection, but starting with a new model, battery packs allowing serial connection through simultaneous blocking technology and freewheeling diodes are being produced.

As such, a control scheme for a battery pack may vary with parallel connection and serial connection, and thus it is important to sense a connection state of the battery pack.

DISCLOSURE

Technical Problem

Embodiments disclosed herein aim to provide a battery management apparatus and method in which a precharge circuit of a reference battery pack among a plurality of battery packs is driven and a link voltage of the other battery packs is measured, thereby identifying a serial or parallel connection state of the battery packs without a separate additional component.

Technical problems of the embodiments disclosed herein are not limited to the above-described technical problems, and other unmentioned technical problems would be clearly understood by one of ordinary skill in the art from the following description.

Technical Solution

A battery management apparatus includes a measuring unit configured to measure a link voltage of each of a plurality of battery packs and a determining unit configured to control a switching circuit provided in each of the plurality of battery packs and determine a connection state of the plurality of battery packs based on a link voltage of the plurality of battery packs corresponding to a driving state of the switching circuit.

According to an embodiment, the determining unit may be configured to determine the connection state of the plurality of battery packs based on the measured link voltage of each of the plurality of battery packs, when the switching circuit provided in a reference battery pack among the plurality of battery packs is driven.

According to an embodiment, the determining unit may be configured to determine that the plurality of battery packs are connected in parallel if the measured link voltage of each of the plurality of battery packs is greater than or equal to a first threshold value, when the switching circuit provided in a reference battery pack among the plurality of battery packs is driven.

According to an embodiment, the determining unit may be configured to determine that the plurality of battery packs are connected in series if the measured link voltage of each of the plurality of battery packs is less than a second threshold value that is less than the first threshold value, when the switching circuit provided in a reference battery pack among the plurality of battery packs is driven.

According to an embodiment, the determining unit may be configured to determine that there is an error in parallel connection of the plurality of battery packs if the measured link voltage of each of the plurality of battery packs is greater than or equal to the second threshold value and is less than the first threshold value, when the switching circuit provided in the reference battery pack among the plurality of battery packs is driven.

According to an embodiment, the determining unit may be configured to drive switching circuits of battery packs other than the reference battery pack if the measured link voltage of each of the plurality of battery packs is less than the second threshold value that is less than the first threshold value, when the switching circuit provided in the reference battery pack among the plurality of battery packs is driven.

According to an embodiment, the determining unit may be configured to receive a switching complete signal from an inverter when all switching circuits provided in the plurality of battery packs are driven.

According to an embodiment, upon receipt of the switching complete signal from the inverter, the determining unit may be configured to determine that the plurality of battery packs are connected in series.

According to an embodiment, upon receipt of the switching complete signal from the inverter, the determining unit may be configured to determine that there is an error in serial connection of the plurality of battery packs.

According to an embodiment, the switching circuit may include a precharge circuit.

A battery management method includes measuring a link voltage of each of a plurality of battery packs and determining a connection state of the plurality of battery packs based on a link voltage of the plurality of battery packs corresponding to a driving state of a switching circuit provided in each of the plurality of battery packs.

Advantageous Effects

A battery management apparatus and method according to an embodiment disclosed herein may drive a precharge circuit of a reference battery pack among a plurality of battery packs and measure a link voltage of the other battery packs, thereby identifying a serial or parallel connection state of the battery packs without a separate additional component.

MODES FOR INVENTION

Figure 1:
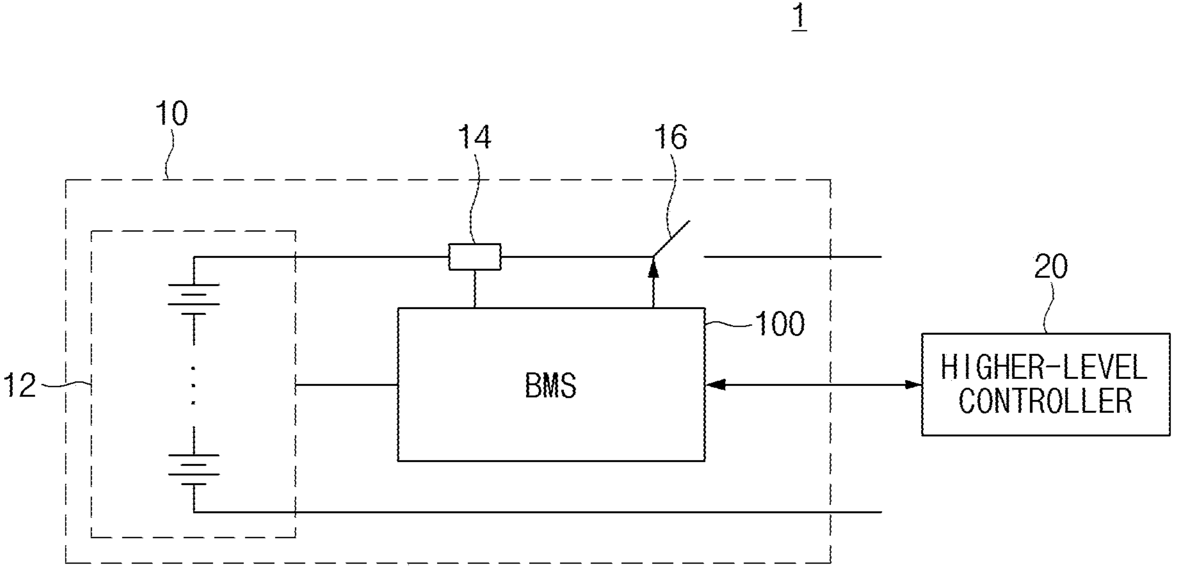
FIG. 1 schematically illustrates a configuration of a battery control system including a battery management apparatus according to an embodiment disclosed herein.

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms and should not be construed as being limited to the embodiments described herein.

As used in various embodiments, the terms "1st," "2nd," "first," "second," or the like may modify various components regardless of order and/or importance, and do not limit the components. For example, a first component may be named as a second component without departing from the right scope of an embodiment disclosed herein, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments disclosed herein.

FIG. 1 schematically illustrates a configuration of a battery control system including a battery management apparatus according to an embodiment disclosed herein.

Referring to FIG. 1, a battery control system 1 may include a battery pack 10 and a higher-level controller 20. The battery pack 10 may include a plurality of battery modules 12, a sensor 14, a switching unit 16, and a battery management apparatus (or a battery management system (BMS)) 100. The battery pack 10 may include the battery module 12, the sensor 14, the switching unit 16, and the battery management apparatus 100 provided in plural. The battery packs 10 may be connected in series or in parallel to communicate with the higher-level controller 20 provided outside.

The plurality of battery modules 12 may include one or more chargeable/dischargeable battery cells. In this case, the plurality of battery modules 12 may be connected in series or in parallel. The sensor 14 may detect current flowing in the battery pack 10. In this case, a detected signal of current may be transmitted to the battery management apparatus 100. The switching unit 16 may be connected in series to a (+) terminal side and a (−) terminal side of the battery module 12 to control the charging/discharging current flow of the battery module 12. For example, the switching unit 16 may use at least one switch, relay, magnetic contactor, etc., according to the specifications of the battery pack 10. In particular, the switching unit 16 may include a precharge circuit for preventing sudden current inflow to the battery pack 10.

The battery management apparatus 100 may monitor the voltage, current, temperature, etc., of the battery rack 10 to perform control and management to prevent overcharging and overdischarging, etc., and may include, for example, a pack BMS.

The battery management apparatus 100, which is an interface for receiving measurement values of various parameter values, may include a plurality of terminals and a circuit, etc., connected to the terminals to process received values. The battery management apparatus 100 may control ON/OFF of the switching unit 16, e.g., a switch, a relay, a contactor, etc., and may be connected to the plurality of battery modules 12 to monitor the state of battery cells.

Meanwhile, the battery management apparatus 100 disclosed herein may measure a link voltage of each of the plurality of battery packs 10 and control a precharge circuit provided in each of the plurality of battery packs 10. In addition, the battery management apparatus 100 may determine whether the connection state of the plurality of battery packs 10 is serial connection or parallel connection, based on a change of the link voltage of each of the battery packs 10 corresponding to a driving state of the precharge circuit. This will be described in detail with reference to FIG. 2.

The higher-level controller 20 may transmit various control signals regarding the battery module 12 to the battery management apparatus 100. Thus, the battery management apparatus 100 may also be controlled in terms of an operation thereof based on a signal applied from the higher-level controller 20. Meanwhile, the battery cell according to the present disclosure may be included in the battery module 12 used for an electric vehicle. However, the battery pack 10 of FIG. 1 is not limited to such a purpose, and for example, a battery rack of an energy storage system (ESS) may be included in place of the battery pack 10 of FIG. 1.

Figure 2:
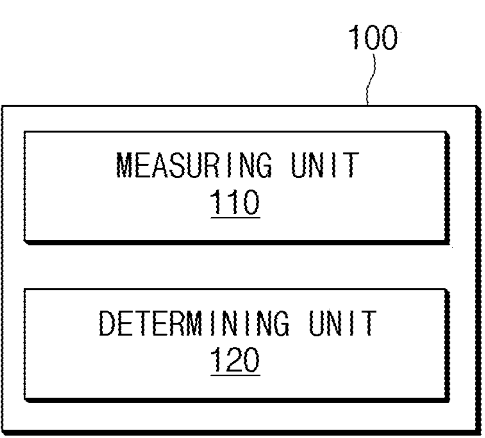
FIG. 2 is a block diagram illustrating a structure of a battery management apparatus, according to an embodiment disclosed herein.

FIG. 2 is a block diagram illustrating a structure of a battery management apparatus, according to an embodiment disclosed herein.

Referring to FIG. 2, the battery management apparatus 100 according to an embodiment disclosed herein may include a measuring unit 110 and a determining unit 120.

The measuring unit 110 may measure a link voltage of each of a plurality of battery packs. For example, the measuring unit 110 may measure a link voltage of the battery packs other than a reference battery pack selected at random (e.g., a battery pack, a precharge circuit of which is driven) among the plurality of battery packs.

The determining unit 120 may control a switching circuit provided in each of the plurality of battery packs. In addition, the determining unit 120 may determine the connection state of the plurality of battery packs, based on a change of the link voltage of the plurality of battery packs corresponding to a driving state of the switching circuit. For example, the switching circuit may include a precharge circuit provided in each battery pack.

The determining unit 120 may drive a switching circuit provided in the reference battery pack among the plurality of battery packs. In this case, the determining unit 120 may determine a connection state of the plurality of battery packs based on a link voltage of each of the plurality of battery packs (e.g., the battery packs other than the reference battery pack), measured in the measuring unit 110.

More specifically, when the switching circuit provided in the reference battery pack among the plurality of battery packs is driven, the determining unit 120 may determine that the plurality of battery packs are connected in parallel if the measured link voltage of each of the plurality of battery packs is greater than or equal to a first threshold value.

When the switching circuit provided in the reference battery pack is driven, the determining unit 120 may determine that the plurality of battery packs are connected in series if the measured link voltage of each of the plurality of battery packs is less than a second threshold value that is less than the first threshold value.

Meanwhile, when the switching circuit provided in the reference battery pack is driven, the determining unit 120 may determine that there is an error in parallel connection of the plurality of battery packs if the measured link voltage of each of the plurality of battery packs is greater than or equal to the second threshold value and is less than the first threshold value.

When the switching circuit provided in the reference battery pack is driven, the determining unit 120 may drive switching circuits of the battery packs other than the reference battery pack if the measured link voltage of each of the plurality of battery packs is less than the second threshold value. In this case, the determining unit 120 may receive a switching complete signal from an inverter when all switching circuits provided in the plurality of battery packs are driven. In this case, a precharge complete signal of the inverter, which has been received from each battery pack or a main battery pack, may be a signal indicating whether to drive a precharge circuit of a battery pack.

Upon receipt of the switching complete signal from the inverter, the determining unit 120 may determine that the plurality of battery packs are connected in series. However, upon failure to receive the switching complete signal from the inverter, the determining unit 120 may determine that there is an error in serial connection of the plurality of battery packs.

As such, the battery management apparatus 100 according to an embodiment disclosed herein may drive a precharge circuit of a reference battery pack among the plurality of battery packs and measure a link voltage of the other battery packs, thereby identifying a serial or parallel connection state of the battery packs without a separate additional component.

Figure 3:
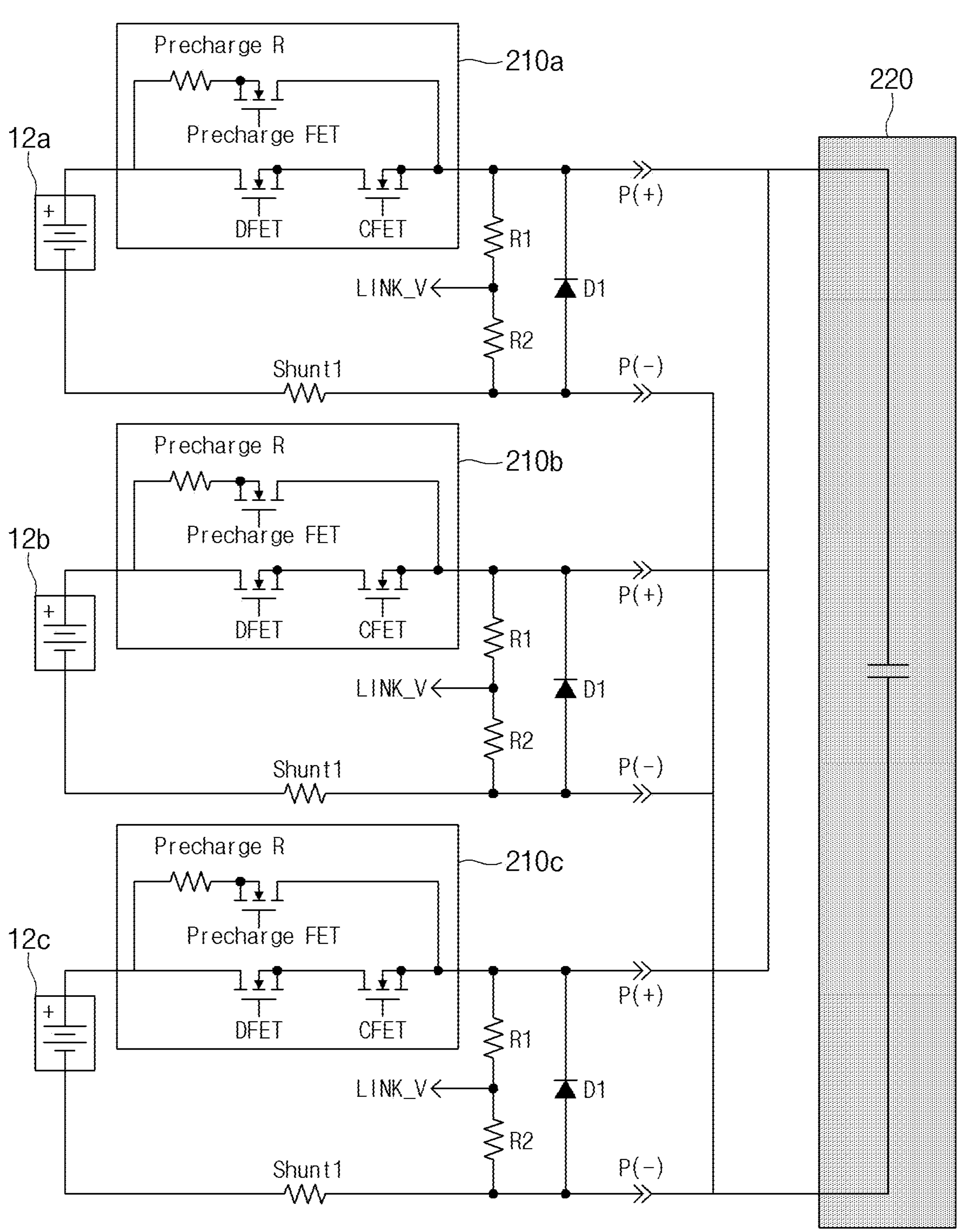
FIG. 3 is a view for describing determining, by a battery management apparatus according to an embodiment disclosed herein, a parallel connection state of a battery pack.
Figure 4:
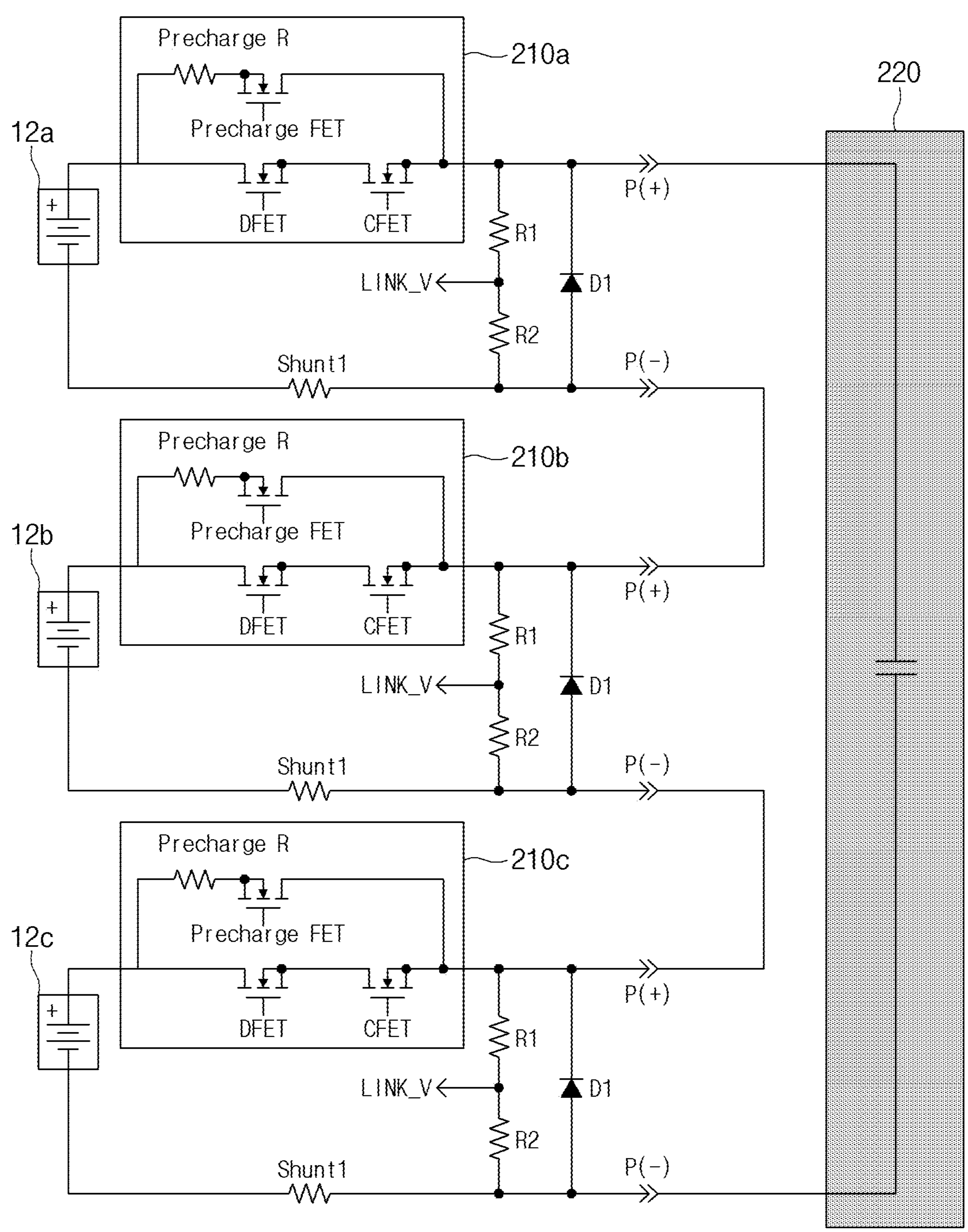
FIG. 4 is a view for describing determining, by a battery management apparatus according to an embodiment disclosed herein, a serial connection state of a battery pack.

FIG. 3 is a view for describing determining, by a battery management apparatus according to an embodiment disclosed herein, a parallel connection state of a battery pack. FIG. 4 is a view for describing determining, by a battery management apparatus according to an embodiment disclosed herein, a serial connection state of a battery pack.

Referring to FIGS. 3 and 4, battery packs may respectively include battery modules 12*a*, 12*b*, and 12*c* and precharge circuits 210*a*, 210*b*, and 210*c*. The plurality of battery packs may be connected to an inverter 220.

For example, one of the plurality of battery packs may be determined as the main battery pack. The main battery pack may integrally manage the other battery packs and may be communication-connected with the inverter 220 to transmit and receive various signals. However, at first, the main battery pack may not know a connection state between battery packs. Thus, in the battery management apparatus 100 according to an embodiment disclosed herein may allow the main battery pack to identify a connection state among a plurality of battery packs with a method described below.

If the plurality of battery packs are connected in parallel as shown in FIG. 3, the battery management apparatus 100 according to an embodiment disclosed herein may drive one of the precharge circuits 210*a*, 210*b*, and 210*c* respectively provided in the battery packs. For example, the battery management apparatus 100 according to an embodiment disclosed herein may drive the lowermost precharge circuit 210*c* among the precharge circuits 210*a*, 210*b*, and 210*c*. In this case, the battery management apparatus 100 may measure a link voltage Link_V of the other battery packs. If the link voltage of the battery pack is sensible (e.g., the link voltage is greater than or equal to the first threshold value), the battery management apparatus 100 may determine that the battery packs are connected in parallel.

Meanwhile, if the plurality of battery packs are connected in series as shown in FIG. 4, the battery management apparatus 100 according to an embodiment disclosed herein may drive one of the precharge circuits 210*a*, 210*b*, and 210*c* respectively provided in the battery packs. For example, the battery management apparatus 100 according to an embodiment disclosed herein may drive the lowermost precharge circuit 210*c* among the precharge circuits 210*a*, 210*b*, and 210*c*. In this case, the battery management apparatus 100 may measure a link voltage Link_V of the other battery packs. If the link voltage of the battery pack is not measured (e.g., the link voltage is less than the second threshold value), the battery management apparatus 100 may determine that the battery packs are connected in series.

As such, the battery management apparatus 100 according to an embodiment disclosed herein may determine an operating scheme suitable for a connection state of the battery pack by identifying the connection state of the battery pack through a precharge circuit function.

Figure 5:
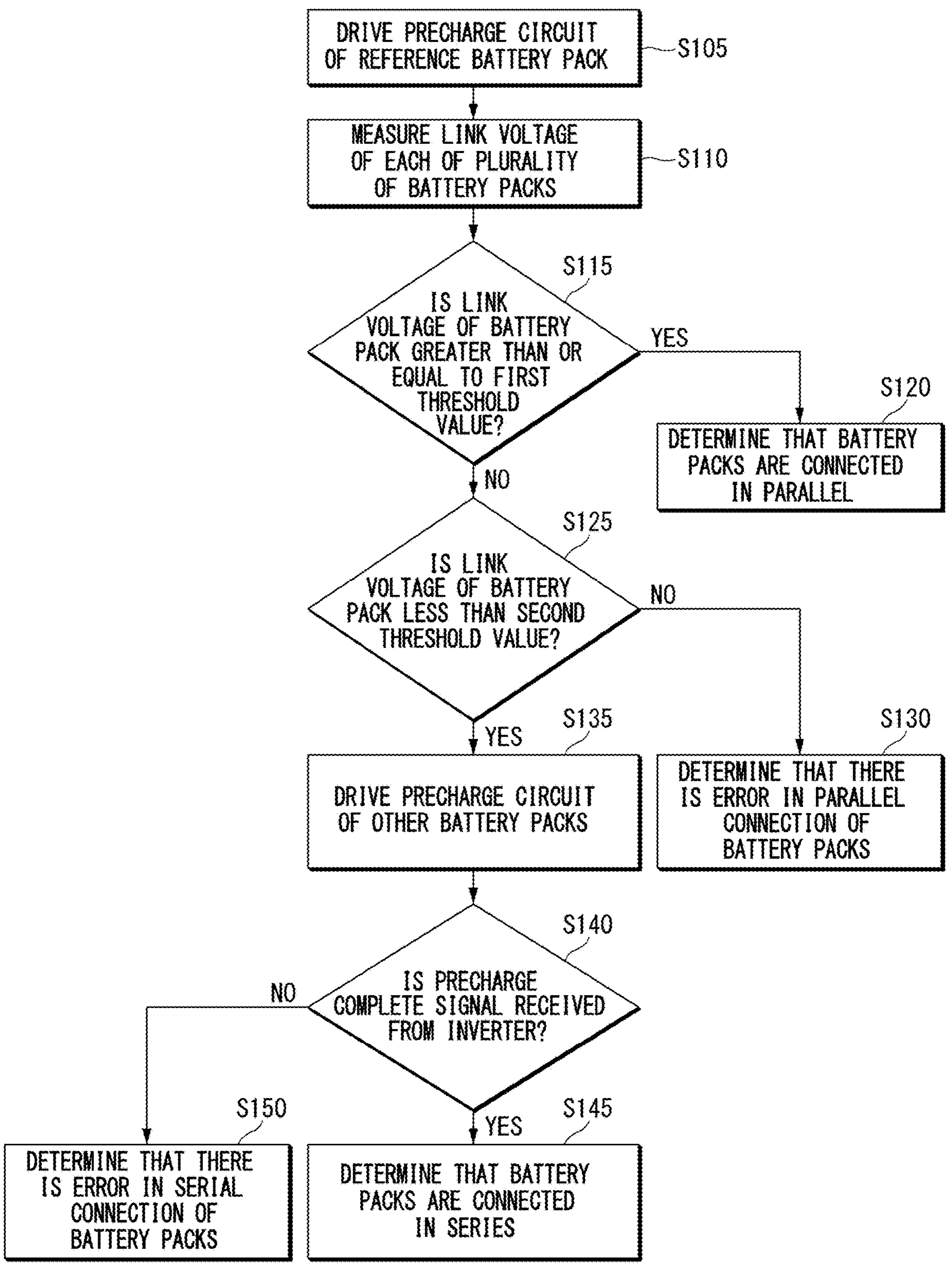
FIG. 5 is a flowchart illustrating a battery management method according to an embodiment disclosed herein.

FIG. 5 is a flowchart illustrating a battery management method according to an embodiment disclosed herein.

Referring to FIG. 5, a battery management method according to an embodiment disclosed herein may drive the precharge circuit of the reference battery pack among the plurality of battery packs, in operation S105. The link voltage of each of the plurality of battery packs may be measured in operation S110. In this case, the link voltage of the battery packs other than the reference battery pack may be measured.

If the link voltage of the battery pack is greater than or equal to the first threshold value in operation S115, it may be determined that the battery packs are connected in parallel, in operation S120. On the other hand, If the link voltage of the battery pack is less than the first threshold value in operation S115, it may be determined that the link voltage of the battery pack is less than the second threshold value, in operation S125. If the link voltage of the battery pack is greater than or equal to the second threshold value, it may be determined that there is an error in parallel connection of the battery packs, in operation S130.

If the link voltage of the battery pack is less than the second threshold value, the precharge circuits of the battery packs other than the reference battery pack are driven in operation S135. The battery management apparatus 100 may determine whether the precharge complete signal is received from the inverter, in operation S140. In this case, the precharge complete signal of the inverter, which has been received from each battery pack or the above-described main battery pack, may be a signal indicating whether to drive the precharge circuit of the battery pack.

If the battery management apparatus 100 receives the precharge complete signal from the inverter, it may be determined that the plurality of battery packs are connected in series, in operation S145. If the battery management apparatus 100 fails to receive the precharge complete signal from the inverter, it may be determined that there is an error in serial connection of the battery packs, in operation S150.

As such, the battery management method according to an embodiment disclosed herein may drive the precharge circuit of the reference battery pack among the plurality of battery packs and measure the link voltage of the other battery packs, thereby identifying the serial or parallel connection state of the battery packs without the separate additional component.

Figure 6:
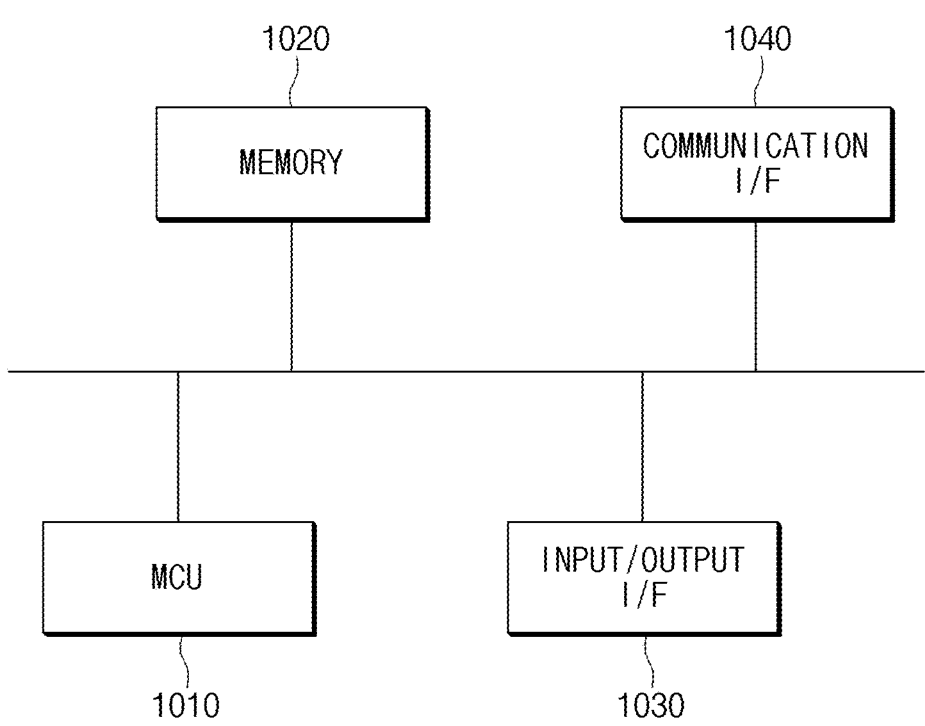
FIG. 6 is a block diagram showing a hardware configuration of a computing system for performing a battery management method according to an embodiment disclosed herein.

FIG. 6 is a block diagram showing a hardware configuration of a computing system for performing a battery management method according to an embodiment disclosed herein.

Referring to FIG. 6, a computing system 1000 according to an embodiment disclosed herein may include a microcontroller unit (MCU) 1010, a memory 1020, an input/output interface (I/F) 1030, and a communication I/F 1040.

The MCU 1010 may be a processor that executes various programs (e.g., a battery precharge control program, a battery connection diagnosis program, etc.) stored in the memory 1020, processes various data including a link, a voltage, etc., of a battery pack through these programs, and executes the above-described functions of the battery management apparatus shown in FIG. 2.

The memory 1020 may store various programs regarding precharge circuit control, connection state diagnosis, etc., of a battery. Moreover, the memory 1020 may store various data such as a link voltage of a battery pack, etc.

The memory 1020 may be provided in plural, depending on a need. The memory 1020 may be volatile memory or non-volatile memory. For the memory 1020 as the volatile memory, random access memory (RAM), dynamic RAM (DRAM), static RAM (SRAM), etc., may be used. For the memory 1020 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 1020 are merely examples and are not limited thereto.

The input/output I/F 1030 may provide an interface for transmitting and receiving data by connecting an input device (not shown) such as a keyboard, a mouse, a touch panel, etc., and an output device such as a display (not shown), etc., with the MCU 1010.

The communication I/F 1040, which is a component capable of transmitting and receiving various data to and from a server, may be various types of devices capable of supporting wired or wireless communication. For example, a program for precharge circuit control or connection state diagnosis of the battery or various data may be transmitted and received to and from a separately provided external server through the communication I/F 1040.

As such, a computer program according to an embodiment disclosed herein may be recorded in the memory 1020 and processed by the MCU 1010, thus being implemented as a module that performs functions shown in FIG. 2.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include," "constitute," or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

The invention claimed is:

1. A battery management apparatus in communication with a plurality of battery packs configured to be connected to each other in parallel or in series, the battery management apparatus comprising:

a voltage measurer configured to measure a link voltage of at least one battery pack other than a reference battery pack, among the plurality of battery packs, the link voltage of the at least one battery pack being a voltage at a link electrically connected across two terminals of the at least one battery pack; and a determiner configured to control a switching circuit provided in the reference battery pack and to determine a connection state among the plurality of battery packs based on the measured link voltage of the at least one battery pack and on a driving state of the switching circuit in the reference battery pack, the switching circuit in the reference battery pack being electrically connected to at least one of the terminals of the reference battery pack.

2. The battery management apparatus of claim 1, wherein, with the switching circuit provided in the reference battery pack driven, the determiner is further configured to determine the connection state among the plurality of battery packs based on the measured link voltage of each of the plurality of battery packs other than the reference battery pack.

3. The battery management apparatus of claim 1, wherein, with the switching circuit provided in the reference battery pack driven, the determiner is further configured to determine that the plurality of battery packs are connected in parallel if the measured link voltage of each of the plurality of battery packs other than the reference battery pack is greater than or equal to a first threshold value.

4. The battery management apparatus of claim 3, wherein, with the switching circuit provided in the reference battery pack driven, the determiner is further configured to determine that the plurality of battery packs are connected in series if the measured link voltage of each of the plurality of battery packs other than the reference battery pack is less than a second threshold value that is less than the first threshold value.

5. The battery management apparatus of claim 4, wherein, with the switching circuit provided in the reference battery pack driven, the determiner is further configured to determine that there is an error in parallel connection of the plurality of battery packs if the measured link voltage of any of the plurality of battery packs other than the reference battery pack is greater than or equal to the second threshold value and is less than the first threshold value.

6. The battery management apparatus of claim 3, wherein the determiner is further configured to drive a switching circuit of each of the plurality of battery packs other than the reference battery pack if, with the switching circuit provided in the reference battery pack driven, the measured link voltage of each of the plurality of battery packs is less than a second threshold value that is less than the first threshold value.

7. The battery management apparatus of claim 6, further comprising an inverter connected to the plurality of battery packs and configured to transmit a switching complete signal when all switching circuits provided in the plurality of battery packs have been driven.

8. The battery management apparatus of claim 7, wherein upon receipt of the switching complete signal from the inverter, the determiner is further configured to determine that the plurality of battery packs are connected in series.

9. The battery management apparatus of claim 7, wherein upon no receipt of the switching complete signal from the inverter, the determiner is further configured to determine that there is an error in serial connection of the plurality of battery packs.

10. The battery management apparatus of claim 1, wherein the switching circuit comprises a precharge circuit.

11. A battery management method, comprising:

driving a switching circuit of a reference battery pack among a plurality of battery packs configured to be connected to each other in parallel or in series, the switching circuit of the reference battery pack being electrically connected to at least one of two terminals of the reference battery pack;

with the switching circuit of a reference battery pack driven, measuring a link voltage of each of a plurality of battery packs other than the reference battery pack, the link voltage of a corresponding battery pack among the plurality of battery packs being a voltage at a link electrically connected across the two terminals of the corresponding battery pack; and determining a connection state among the plurality of battery packs based on the measured link voltage of each of the plurality of battery packs other than the reference battery pack.

12. The battery management method of claim 11, wherein the determining of the connection state includes determining that the plurality of battery packs are connected in parallel when the measured link voltage of each of the plurality of battery packs other than the reference battery pack is greater than or equal to a first threshold value.

13. The battery management method of claim 12, wherein the determining of the connection state further includes determining that the plurality of battery packs are connected in series when the measured link voltage of each of the plurality of battery packs other than the reference battery pack is less than a second threshold value that is less than the first threshold value.

14. The battery management method of claim 13, wherein the determining of the connection state further includes determining that there is an error in parallel connection of the plurality of battery packs when the measured link voltage of any of the plurality of battery packs other than the reference battery pack is greater than or equal to the second threshold value and is less than the first threshold value.

15. The battery management method of claim 12, further comprising:

driving a switching circuit of each of the plurality of battery packs other than the reference battery pack when, with the switching circuit provided in the reference battery pack driven, the measured link voltage of each of the plurality of battery packs other than the reference battery pack is less than a second threshold value that is less than the first threshold value.

16. The battery management method of claim 15, further comprising:

transmitting a switching complete signal when all switching circuits provided in the plurality of battery packs have been driven.

17. The battery management method of claim 16, further comprising:

determining that the plurality of battery packs are connected in series upon receipt of the switching complete signal.

18. The battery management method of claim 16, further comprising:

determining that there is an error in serial connection of the plurality of battery packs upon no receipt of the switching complete signal.

19. The battery management method of claim 11, wherein the switching circuit comprises a precharge circuit.

* * * * *